United States Patent [19]

Manako et al.

[11] Patent Number: 5,721,654
[45] Date of Patent: Feb. 24, 1998

[54] MAGNETOMETRIC SENSOR MAGNETICALLY ISOLATED TWO REGIONS FORMED OF SPIN-POLARIZED MATERIAL AND MAGNETIC HEAD USING THE SAME

[75] Inventors: Takashi Manako; Yoshimi Kubo; Yuichi Shimakawa, all of Tokyo, Japan

[73] Assignee: NEC Corporation, Tokyo, Japan

[21] Appl. No.: 754,809

[22] Filed: Nov. 21, 1996

[30] Foreign Application Priority Data

Nov. 30, 1995  [JP]  Japan ................. 7-312380

[51] Int. Cl.$^6$ ........................ G11B 5/127; G11B 5/33
[52] U.S. Cl. .................. 360/110; 360/113; 360/119; 360/126
[58] Field of Search .................... 360/110–127; 324/252, 249; 338/32 R

[56] References Cited

U.S. PATENT DOCUMENTS 5,432,373  7/1995  Johnson ................. 360/113
5,652,445  7/1997  Johnson ................. 360/113
5,654,566  8/1997  Johnson ................. 360/113

OTHER PUBLICATIONS

M. Johnson, "Bipolar Spin Switch", *Science*, vol. 260, Apr. 16, 1993, pp. 320–323.

*Primary Examiner*—Robert S. Tupper
*Attorney, Agent, or Firm*—Sughrue, Mion, Zinn, Macpeak & Seas, PLLC

[57] ABSTRACT

A magnetometric sensor has a wide p-portion formed of almost perfectly spin-polarized material, a wide d-portion also formed of almost perfectly spin-polarized material different in coercive force and a narrow n-portion provided between the wide p-portion and the wide d-portion formed of the almost perfectly spin-polarized material or non-magnetic material, and one of the p-portion and the d-portion changes the spin axes of the conduction electrons in the opposite direction to the other in the presence of a magnetic field for providing a potential gap between the Fermi surface of the p-portion and the Fermi surface of the d-portion, thereby causing electric current to change the amount thereof.

20 Claims, 11 Drawing Sheets

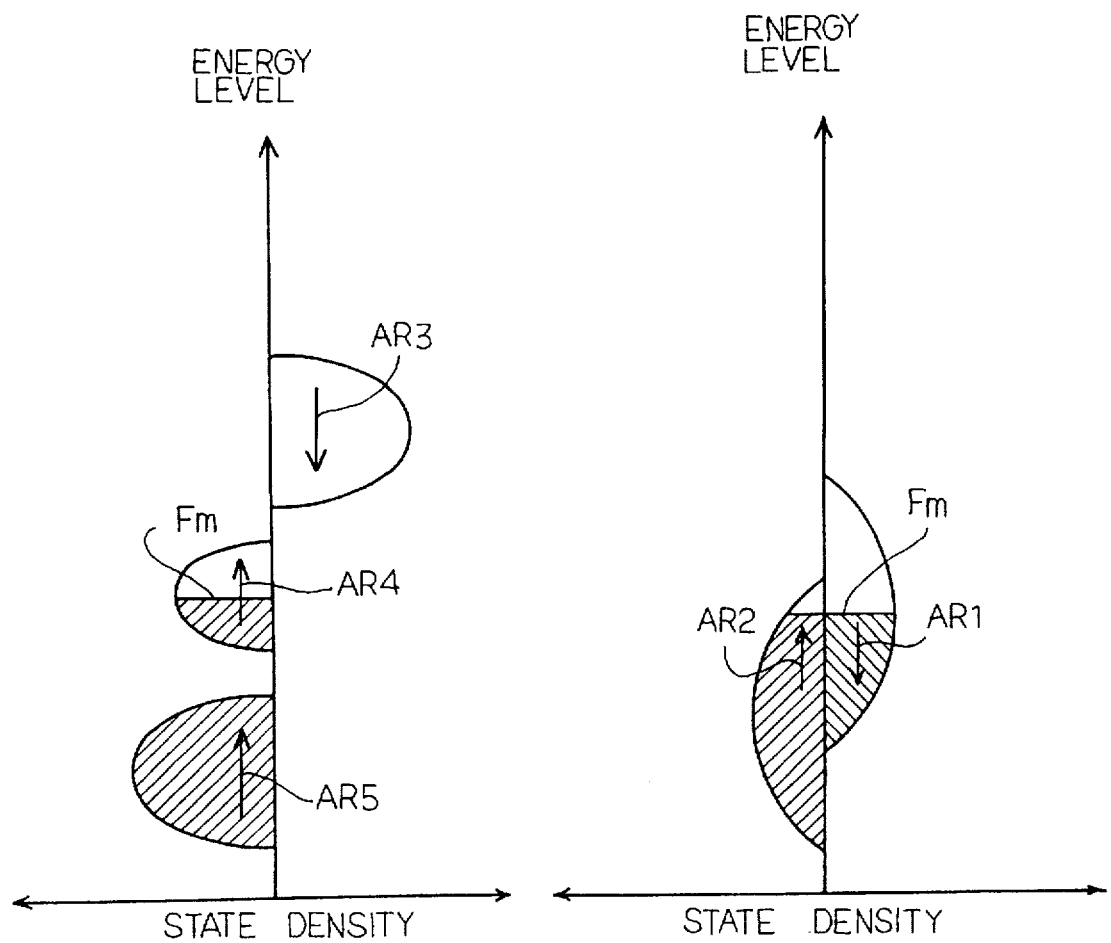

MAGNETOMETRIC SENSOR MAGNETICALLY ISOLATED TWO REGIONS FORMED OF SPIN-POLARIZED MATERIAL AND MAGNETIC HEAD USING THE SAME

FIELD OF THE INVENTION

This invention relates to a magnetometric sensor and, more particularly, to a magnetic sensor for detecting variation of a magnetic field strength and a magnetic head with the magnetic sensor available for a high-density magnetic recording system.

DESCRIPTION OF THE RELATED ART

A high-density magnetic recording system such as a magnetic disk memory requires a miniature magnetometric sensor capable of detecting an extremely small variation of magnetic field strength. The miniature magnetometric sensor is incorporated in a magnetic head, and detects variation of the magnetic field strength produced by a magnetic recording medium.

The magnetic head widely used for the magnetic disk memory is called as "Induction-type Magnetic Head". The induction-type magnetic head leads the magnetic flux from the magnetic recording medium to a coil. The magnetic flux induces electric current in the coil serving as the magnetometric sensor, and the amount of current is in proportional to the rate of change in the magnetic flux. Thus, the magnetometric sensor converts the variation of magnetic field strength or the magnetic flux density to the electric current.

The magnetic recording density is getting higher and higher, and, on the contrary, the magnetic field leaked from the recording medium is getting smaller and smaller. Moreover, the magnetic recording system is scaled down, and the magnetic recording medium is miniaturized. This results in reduction of a relative speed between the magnetic head and the magnetic recording medium and, accordingly, reduction of the rate of change in magnetic field strength. The rate of change in magnetic field strength almost reaches the limit of the induction-type magnetic head.

An attractive candidate for passing beyond the limit is known as "MR (Magneto-Resistance) Head" using the magnetoresistance effect for detecting an extremely small variation of magnetic field strength. The MR head has been already installed in a magnetic disk memory. However, it is confident that the MR head reaches its detectable limit, because the user expects the magnetic recording system to achieve the recording density much higher than now.

SUMMARY OF THE INVENTION

It is therefore an important object of the present invention to provide a magnetometric sensor which detects variation of magnetic field strength much smaller than that at the detectable limit of the presently available MR head.

It is also an important object of the present invention to provide a magnetic head in which the magnetometric sensor is incorporated.

To accomplish the object, the present invention proposes to change spin axes of conduction electrons in one of two magnetically isolated portions depending upon a magnetic field strength so as to vary a potential difference between the two regions.

In accordance with one aspect of the present invention, there is provided a magnetometric sensor for detecting a variation of a magnetic field strength, comprising, a first portion and a second portion different in coercive force, at least one of the first portion and the second portion being formed of a first almost perfectly spin-polarized material where spin axes of conduction electrons change a direction thereof in the presence of the variation of the magnetic field strength, and a third portion formed between the first portion and the second portion, and providing a potential gap between a Fermi surface of the first portion and a Fermi surface of the second portion due to the change of direction of the spin axes.

In accordance with another aspect of the present invention, there is provided a magnetic head comprising a magnetometric sensor for detecting a variation of a magnetic field strength, and the magnetometric sensor includes a first portion and a second portion different in coercive force, at least one of the first portion and the second portion being formed of a first almost perfectly spin-polarized material where spin axes of conduction electrons change a direction thereof in the presence of the variation of the magnetic field strength, and a third portion formed between the first portion and the second portion, and providing a potential gap between a Fermi surface of the first portion and a Fermi surface of the second portion due to the change of direction of the spin axes.

BRIEF DESCRIPTION OF THE DRAWINGS

The features and advantages of the magnetometric sensor and the magnetic head according to the present invention will be more clearly understood from the following description taken in conjunction with the accompanying drawings in which:

FIG. 3A is an energy diagram showing a relation between state density and energy level created in a ferromagnetic material;

FIG. 3B is an energy diagram showing a relation between state density and energy level created in a perfectly spin-polarized material;

DESCRIPTION OF THE PREFERRED EMBODIMENTS

First Embodiment

Figure 1:
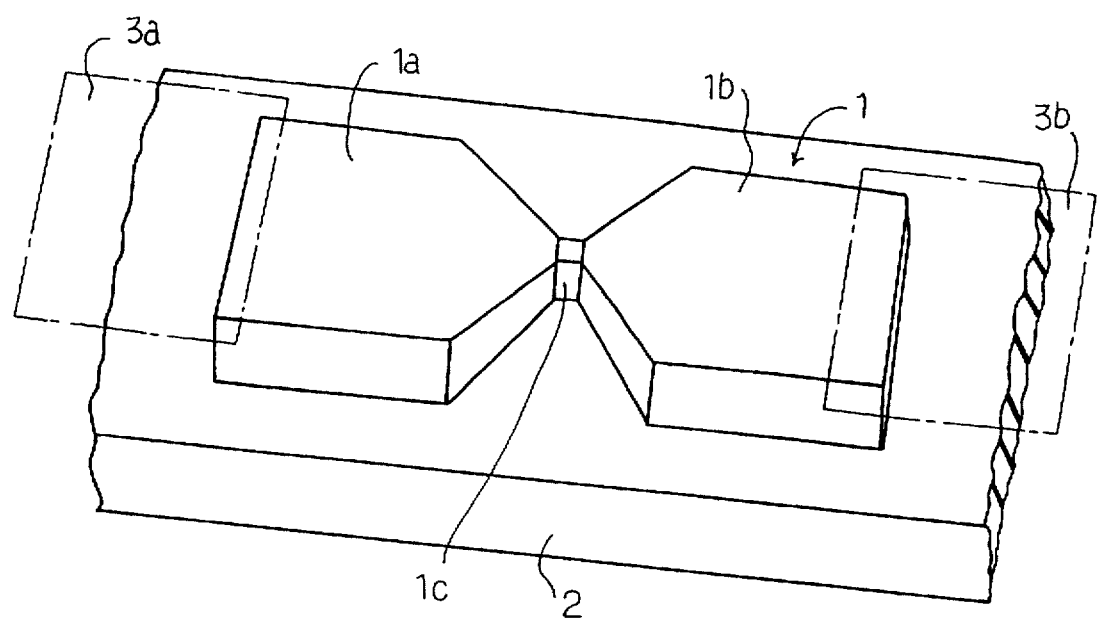
FIG. 1 is a perspective view showing the structure of a magnetometric sensor according to the present invention.

Referring first to FIG. 1 of the drawings, a magnetometric sensor I embodying the present invention is fabricated on a substrate 2, and is connected through electrodes 3a/3b to an electric power source (not shown). The magnetometric sensor 1 includes a p-portion 1a, a d-portion 1b and a transit portion or an n-portion 1c sandwiched between the p-portion la and the d-portion 1b.

The p-portion 1a and the d-portion 1b are shaped into a generally trapezoidal column configuration, and are formed of certain material having conduction electrons the spin axes of which are almost perfectly polarized. It is desirable for the p-portion 1a and the d-portion 1b to be formed of material having the perfectly spin-polarized conduction electrons. However, even if the polarization of spin axes is of the order of 60 percent, such an almost perfectly spin-polarized material is available for the p-portion 1a and the d-portion 1b. In the following description, term "almost perfectly spin-polarized material" contains material polarized at 100 percent.

The p-portion 1a may be formed of the almost perfectly spin-polarized material same as that of the d-portion 1b or different almost perfectly spin-polarized material from that of the d-portion 1b.

When the p-portion 1a is formed of the almost perfectly spin-polarized material same as that of the d-portion, it is necessary to make the coercive force different between the p-portion 1a and the d-portion 1b. A shape anisotropy between the p-portion 1a and the d-portion 1b makes the effective coercive force different therebetween. For example, if the p-portion 1a and the d-portion 1b are shaped into a thin bar-like configuration and a circular cylindrical configuration, only the d-portion 1b changes the direction of magnetization in a weak magnetic field, and changes the electric resistance therebetween. The larger the shape anisotropy is, the wider the detectable magnetic field range is.

Another approach to the different coercive force is to provide a magnetization fixing layer to one of the p-portion 1a and the d-portion 1b. The magnetization fixing layer may be formed of iron.

On the other hand, when the p-portion 1a and the d-portion 1b are formed of different almost perfectly spin-polarized materials, the almost perfectly spin-polarized material for the p-portion 1a and the almost perfectly spin-polarized material for the d-portion 1b are expected to make the coercive force different to a degree achieving the effect of the invention. The detectable magnetic field falls within the difference in the coercive force. For this reason, it is desirable for the combination of almost perfectly spin-polarized materials to enlarge the difference in coercive force. Some examples of the almost perfectly spin-polarized material will be described hereinlater.

The n-portion 1c is expected to provide a domain wall between the p-portion 1a and the d-portion 1b. The n-portion 1c is so narrow that the domain wall is fixed therein. As a result, the direction of the spontaneous magnetization is independently controlled in the p-portion 1a and the d-portion 1b.

The n-portion 1c may be formed of the almost perfectly spin-polarized material same as that of the p-portion 1a and the d-portion 1b or differently formed of non-magnetic material. Paramagnetic material is available for the n-portion. The non-magnetic material may be conductive material or insulating material.

When the n-portion 1c is formed of the almost perfectly spin-polarized material same as that of the p-portion 1a and the d-portion 1b, the p-portion 1a, the d-portion 1b and the n-portion 1c are concurrently patterned from a layer of the almost perfectly spin-polarized material on the substrate 2.

Figure 2:
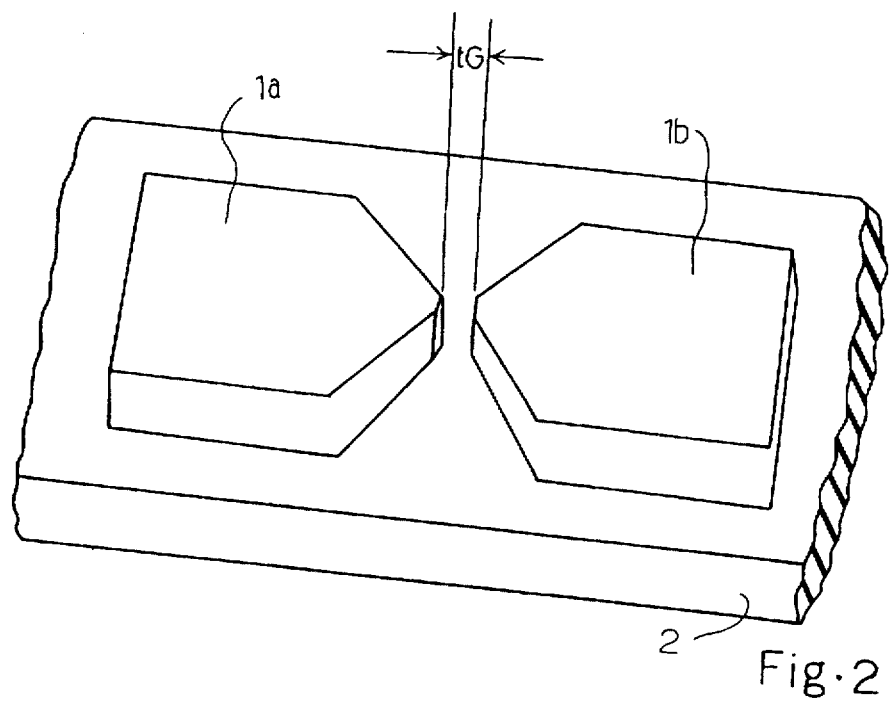
FIG. 2 is a perspective view showing an essential step of a process of fabricating the magnetometric sensor according to the present invention.

On the other hand, when the n-portion 1c is formed of different non-magnetic material, an almost perfectly spin-polarized material layer is firstly deposited on the substrate 2, the almost perfectly spin-polarized material layer is patterned into the p-portion la and the d-portion 1b spaced from each other by a gap tG as shown in FIG. 2, and, finally the n-portion 1c is formed of the non-magnetic material between the p-portion 1a and the d-portion 1b.

FIGS. 3A illustrates a relation between state density and energy level created in a ferromagnetic material, and FIG. 3B illustrates the same relation created in a perfectly spin-polarized material. Fm stands for the Fermi surface, and arrows AR1 to AR5 indicate the spin axes. The electrons fill the energy levels below the Fermi surface as indicated by hatching lines.

The electrons fill both spin bands of the ferromagnetic material, and the Fermi surface is spread in both spin bands different in spin axis AR1/AR2. On the other hand, the electrons of the perfectly spin-polarized material occupy the spin bands with the spin axes AR4/AR5 oriented to one direction, and the electrons with the spin axes AR4/AR5 form the Fermi surface Fm. The electrons in the vicinity of the Fermi surface participate electric conduction.

Figure 4A:
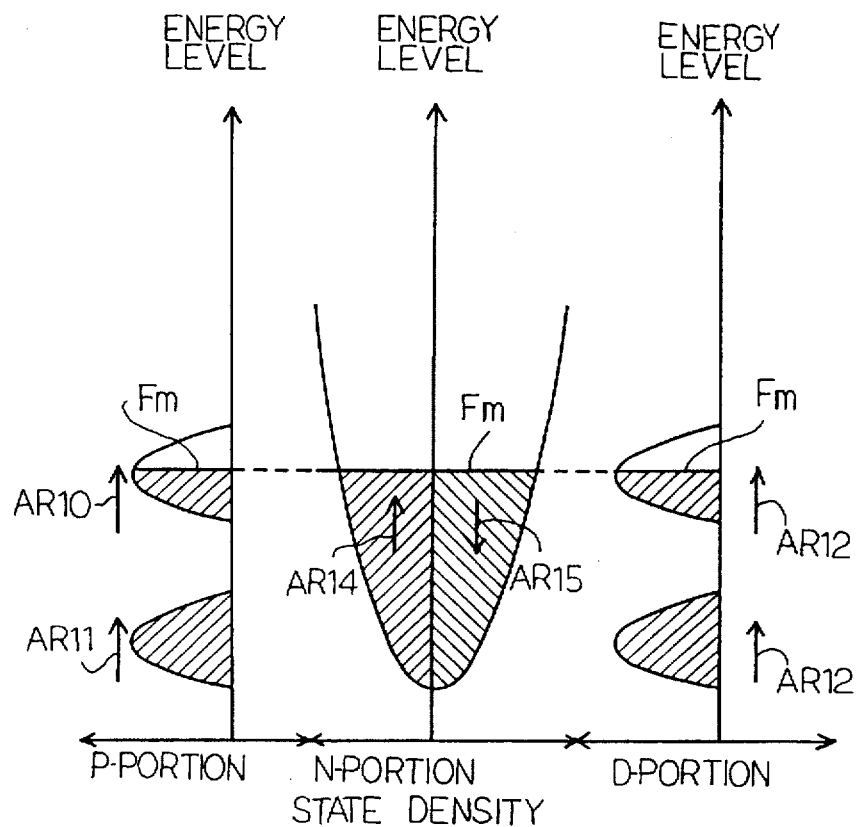
FIGS. 4A and 4B are energy diagrams showing energy states of the magnetometric sensor of the perfectly spin-polarized material under differently spin-polarized p-portion/d-portion.
Figure 4B:
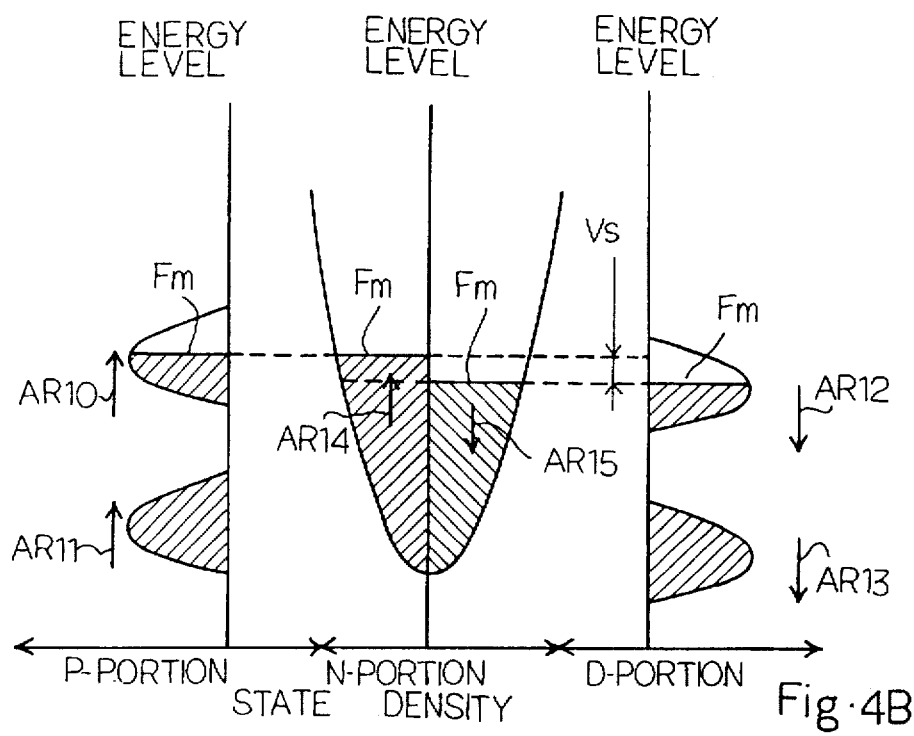

The electric resistance between the p-portion 1a and the d-portion 1b is varied depending upon a relative relation in the direction of spin axes of the conductive electrons between the almost perfectly spin-polarized p-portion 1a and the almost perfectly spin-polarized d-portion 1b as shown in FIGS. 4A and 4B.

When the magnetometric sensor 1 is biased in such a manner as to inject the electrons from the p-portion 1a to the d-portion 1b, the energy state of the p-portion 1a, the n-portion 1c and the d-portion 1b is different depending upon the spin axes of the p-portion/d-portion 1a/1b. The electrons injected into the n-portion 1c form a density of electrons having the spin axes oriented in the upward/ downward directions, and the density is deviated from the thermal equilibrium in the n-portion 1c due to the spin-polarization.

In this situation, if the spin axes AR10/AR11 of the p-portion 1a are identical with the spin axes AR12/AR13 of the d-portion 1b in the spontaneous magnetization as shown in FIG. 4A, the Fermi level Fm is equalized in the p-portion 1a, the n-portion 1c and the d-portion 1b, and the electrons injected from the d-portion 1b into the n-portion 1c flows into the p-portion without reduction of a potential level.

On the other hand, if the spin axes AR10/AR11 in the p-portion 1a are opposite to the spin axes AR12/AR13 in the d-portion 1b as shown in FIG. 4B, a potential difference Vs takes place between a part of the n-portion 1c represented by the spin axis AR14 and the remaining part of the n-portion 1c represented by the spin axis AR15, and is detectable through the current passing through the n-portion 1c.

Thus, the magnetometric sensor 1 inverts the direction of magnetization in one of the p-portion 1a and the d-portion 1b in the presence of a magnetic field so as to create the potential difference Vs, and the potential difference Vs represents the magnetic field.

The present inventors fabricated examples of the magnetometric sensor 1 as follows. The present inventors evaluated the examples, and confirmed the detecting characteristics.

EXAMPLE 1

The present inventors firstly prepared a substrate 2 formed of $SrTiO_3$, and $La_{0.7}Sr_{0.3}MnO_3$ was deposited to 1 micron thick on a major surface of the substrate 2 by using a laser ablation method. The major surface was covered with a thin film of $La_{0.7}Sr_{0.3}MnO_3$.

Electron beam resist was spread over the entire surface of the thin film so as to laminate an electron beam resist layer on the thin film. A latent image was written into the electron beam resist layer by using a direct writing technique, and the electron beam resist layer was patterned into a resist mask through a development of the latent image. The resist mask was corresponding to the generally trapezoidal p-portion 1a and the generally trapezoidal d-portion 1b spaced from each other by the gap tG of 0.1 micron.

Figure 5:
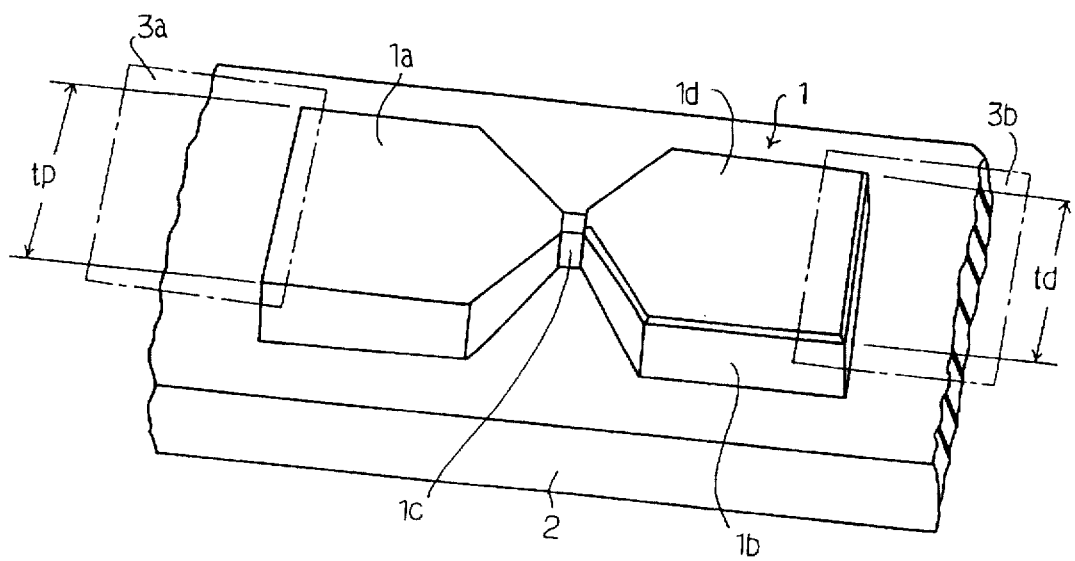
FIG. 5 is a perspective view showing the first example of the magnetometric sensor shown in FIG. 1.

Using the resist mask, the thin film was patterned into the generally trapezoidal columns by using an ion milling. The generally trapezoidal columns had respective confronted surfaces, and the confronted surfaces were 1 micron square. Thus, the p-portion 1a and the d-portion 1b were formed on the substrate 2 as shown in FIG. 2. In this instance, the width tp of the p-portion 1a was equal to the width td of the d-portion 1b (see FIG. 5). The resist mask was stripped off.

Subsequently, gold was deposited to 1 micron thick over the p-portion 1a and the d-portion 1b by using an evaporation technique. The gold filled the gap tG, and the p-portion 1a and the d-portion 1b were covered with the gold film.

Electron beam resist was spread over the gold film, and a latent image corresponding to the n-portion 1c was formed in the electron beam resist layer by using the direct writing technique. The electron beam resist layer was patterned into a resist mask through the development, and the gold film was selectively removed by using the ion milling. As a result, the n-portion 1c was formed beneath the resist mask, and the resist mask was stripped off. The n-portion 1c was held in contact with the p-portion 1a and the d-portion 1b, and the contact areas were 1 micron square. The p-portion 1a, the d-portion 1b and the n-portion formed in combination the magnetometric sensor 1 shown in FIG. 1.

Subsequently, electron beam resist was spread over the entire surface of the magnetometric sensor 1, and a latent image of the d-portion was directly written in the electron beam resist layer by using an electron beam. The latent image was developed, and the electron beam resist layer is partially removed so as to expose the d-portion 1b. Iron was deposited over the entire surface of the structure, i.e., at least the d-portion and the remaining portion of the electron beam resist layer.

The ion film was removed together with the remaining electron beam resist layer into acetone by using an ultrasonic cleaning apparatus, and an ion film 1d was left on the d-portion only. The iron film 1d on the d-portion 1b served as a magnetization fixing layer.

The electron beam lithography was repeated so as to provide a resist mask for the electrodes 3a and 3b. The p-portion 1a and the d-portion 1b were partially exposed to openings formed in the resist mask, and gold was sputtered onto the entire surface. The gold film was partially removed together with the rest mask. Then, the gold electrodes 3a and 3b were left on the p-portion 1a and the d-portion 1b.

Figure 6:
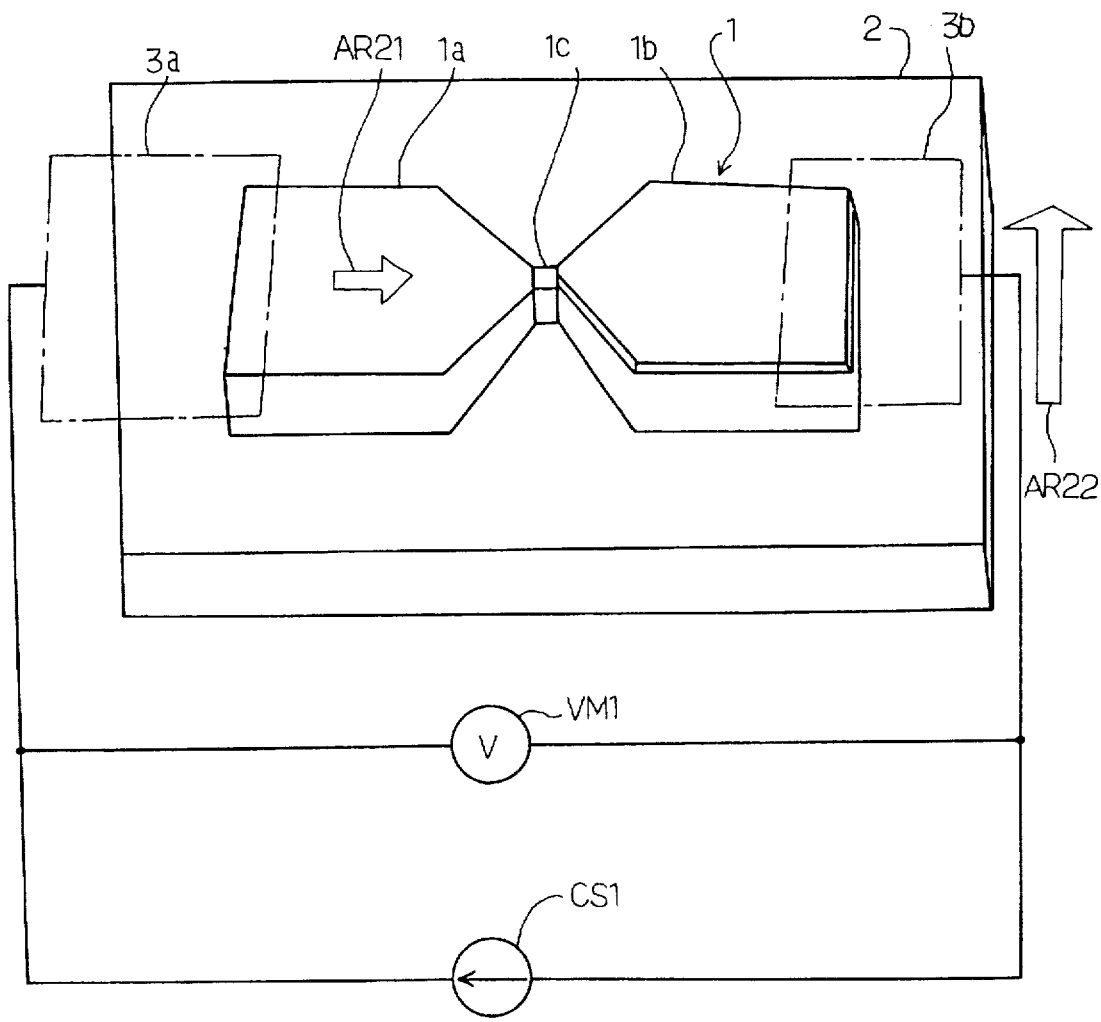
FIG. 6 is a perspective view showing an electrical connection for measuring a potential gap created in the magnetometric sensor.

The present inventors connected the first example of the magnetometric sensor 1 to a current source CS1 as shown in FIG. 6, and a voltage meter VM1 was further connected in parallel to the current source CS1. Electric current flowed as indicated by arrow AR21, and a magnetic field of 1 kG was created as indicated by arrow AR22. The arrow AR21 was perpendicular to the arrow AR22. Then, the magnetic field oriented the magnetization of the p-portion 1a, the magnetization of d-portion 1b and the magnetization of magnetization fixing layer 1d to the same direction. Thereafter, the present inventors removed the magnetic field, and measured the resistance of the magnetometric sensor 1. The resistance was 5 ohms.

Subsequently, the present inventors changed the magnetic field to the direction opposite to arrow AR22 as the current flowed from the p-portion 1a to the d-portion 1b. When the magnetic field strength was close to 50 G, the magnetometric sensor 1 suddenly increased the resistance to 10 ohms. This phenomenon was derived from the following fact. Although the p-portion 1a perfectly inverted the direction of magnetization due to the change of the magnetic field, the d-portion maintained the direction of magnetization by virtue of the large coercive force of the iron film, and the potential difference Vs took place in the n-portion 1c. Thus, the magnetometric sensor 1 increased the resistance at 100 percent with respect to the initial state, and achieved the sensitivity of 2 percent/G.

The present inventors further fabricated a magnetometric sensor similar to the first example except for the location of the magnetization fixing layer. The p-portion 1a was covered with a magnetization fixing layer of iron, and the magnetization fixing layer was removed from the d-portion 1b. The present inventors measured the increment of the resistance as similar to the first example, and confirmed the sensing characteristics substantially identical with that of the first example.

EXAMPLE 2

The present inventors fabricated the second example on a substrate 5 of $SrTiO_3$ as follows. First, the substrate 5 of $SrTiO_3$ was prepared, and $Tl_2Mn_2O_7$ was deposited to 1 micron thick on a major surface of the substrate 5 by using a laser ablation method. The major surface was covered with a thin film of $Tl_2Mn_2O_7$.

Figure 7:
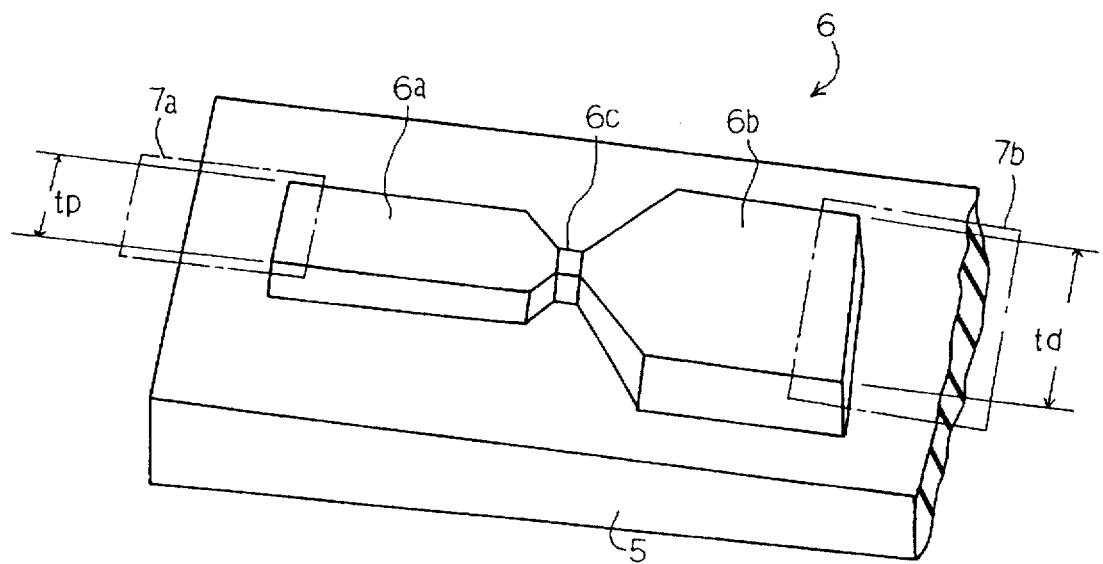
FIG. 7 is a perspective view showing the second example of the magnetometric sensor shown in FIG. 1.

Electron beam resist was spread over the entire surface of the thin film so as to laminate an electron beam resist layer thereon. A latent image was written into the electron beam resist layer by using a direct writing technique, and the electron beam resist layer was patterned into a resist mask through a development of the latent image. The resist mask was corresponding to a generally trapezoidal p-portion 6a and a generally trapezoidal d-portion 6b spaced from each other by the gap tG of 0.1 micron (see FIG. 7).

Using the resist mask, the thin film was patterned into the generally trapezoidal columns by using an ion milling. The generally trapezoidal columns had respective confronted surfaces, and the confronted surfaces were 1 micron square. Thus, the p-portion 6a and the d-portion 6b were formed on the substrate 5 as similar to the first example. In this instance, the d-portion 6b was five times wider than the p-portion 6a, and there was a shape anisotropy between the p-portion 6a and the d-portion 6b. The resist mask was stripped off.

Subsequently, gold was deposited to 1 micron thick over the p-portion 6a and the d-portion 6b by using an evaporation technique. The gold filled the gap tG, and the p-portion 6a and the d-portion 6b were covered with the gold film.

Electron beam resist was spread over the gold film, and a latent image corresponding to an n-portion 6c (see FIG. 7) is formed in the electron beam resist layer by using the direct writing technique. The electron beam resist layer was patterned into a resist mask through the development, and the resist mask exposed the gold film to the ion milling except for the gold therebeneath. As a result, the n-portion 6c was formed beneath the resist mask, and the resist mask was stripped off. The n-portion 6c was held in contact with the p-portion 6a and the d-portion 6b, and the contact areas were 1 micron square. The p-portion 6a, the d-portion 6b and the n-portion 6c formed in combination a magnetometric sensor 6.

The electron beam lithography was repeated so as to provide a resist mask for electrodes 7a and 7b. The p-portion 6a and the d-portion 6b were partially exposed to openings formed in the resist mask, and gold was sputtered onto the entire surface. The gold film was partially removed together with the rest mask. Then, the gold electrodes 7a and 7b were left on the p-portion 6a and the d-portion 6b.

The present inventors connected the second example of the magnetometric sensor 6 to a current source, and a voltage meter VM1 was further connected in parallel to the current source as similar to the first example. Electric current flowed from the p-portion 6a to the d-portion 6b, and a magnetic field of 1 kG was applied in a perpendicular direction to the electric current. Then, the magnetic field oriented the magnetization of the p-portion 6a and the magnetization of d-portion 6b in the same direction. Thereafter, the present inventors removed the magnetic field, and measured the resistance of the magnetometric sensor 6.

Subsequently, the present inventors changed the magnetic field to the opposite direction as the current flowed from the p-portion 6a to the d-portion 6b. When the magnetic field strength reached about 40 G, only the p-portion 6a inverted the direction of magnetization, and magnetometric sensor 6 suddenly increased the resistance. The ratio between the resistances was 120 percent.

EXAMPLE 3

The present inventors fabricated the third example as follows. The fabrication process started with preparation of a substrate 8 formed of $SrTiO_3$, and $TlInMn_2O_7$ was deposited to 1 micron thick on a major surface of the substrate 8 by using a laser ablation method. The major surface was covered with a thin film of $TlInMn_2O_7$.

Figure 8:
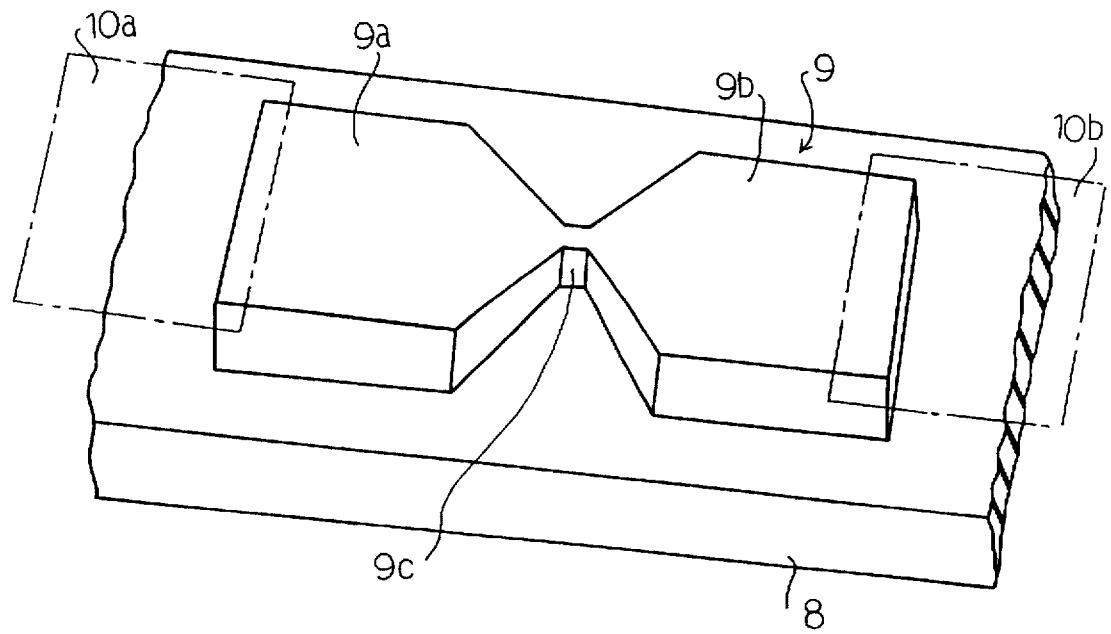
FIG. 8 is a perspective view showing the third example of the magnetic sensor shown in FIG. 1.

Electron beam resist was spread over the entire surface of the thin film so as to laminate an electron beam resist layer on the thin film. A latent image was written into the electron beam resist layer by using a direct writing technique, and the electron beam resist layer was patterned into a resist mask through a development of the latent image. The resist mask had a partially constricted configuration corresponding to a p-portion 9a, a d-portion 9b and an n-portion 9c shown in FIG. 8.

Using the resist mask, the thin film was patterned into the partially constricted configuration by using an ion milling. The left side portion of the partially constricted configuration and the right side portion were shaped into the generally trapezoidal columns, and served as the p-portion 9a and the d-portion 9b equal in width to each other. The constricted portion between the p-portion 9a and the d-portion 9b served as the n-portion 9c, and had a cross section of 1 micron square. Thus, the p-portion 9a, the d-portion 9b and the n-portion 9c were merged with one another, and were formed of the same material. Although the p-portion 9a was not perfectly magnetically isolated from the d-portion 9b, a domain wall took place in the n-portion 9c in the presence of the p-portion 9a and the d-portion 9b oppositely magnetized to each other, because it was required to create the domain wall under the minimum energy. The resist mask was stripped off.

The electron beam lithography was carried out so as to provide a resist mask for electrodes 10a and 10b. The p-portion 9a and the d-portion 9b were partially exposed to openings formed in the resist mask, and gold was sputtered onto the entire surface. The gold film was partially removed together with the rest mask. Then, the gold electrodes 10a and 10b were left on the p-portion 9a and the d-portion 9b.

The present inventors evaluated the third example as similar to the first example. The inversion of the direction of magnetization took place at 80 G, and the resistance was increased at 100 percent.

Second Embodiment

Figure 9:
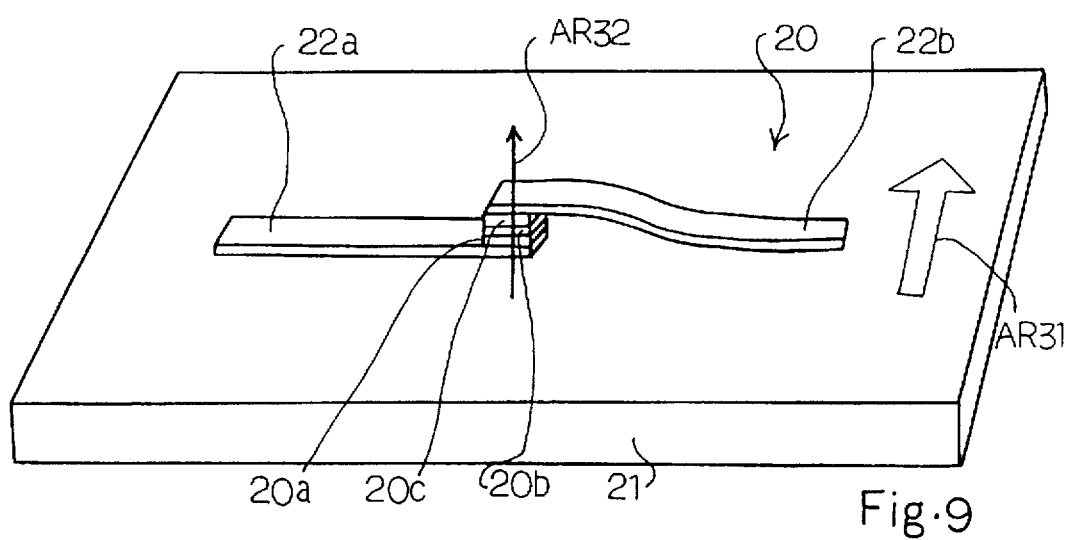
FIG. 9 is a perspective view showing the structure of another magnetometric sensor according to the present invention.

Turning to FIG. 9 of the drawings, another magnetometric sensor 20 embodying the present invention is fabricated on a substrate 20. A p-portion 20a, an n-portion 20b and a d-portion 20c are stacked between a lower electrode 22a and an upper electrode 22b. The n-portion 20b has the same cross section as the p-portion 20a and the n-portion 20b.

The p-portion 20a and the d-portion 20c are formed of the almost perfectly spin-polarized materials different in the coercive force, i.e., the composition. Alternatively, one of the p-portion 20a and the d-portion 20c is formed of the almost perfectly spin-polarized material, and the other is formed of ferromagnetic material.

The n-portion 20b is formed of non-magnetic material. Both conductive and insulating materials are available in so far as they are non-magnetic material.

The present inventors fabricated several examples of the magnetometric sensor 20 as described hereinbelow.

EXAMPLE 1

The present inventors fabricated the first example as follows. The fabrication process started with preparation of a substrate 21. The substrate 21 was formed of $SrTiO_3$.

Electron beam resist was spread over a major surface of the substrate 21, and a latent image corresponding to the lower electrode 22a was directly written into the electron beam resist layer. The latent image was developed, and a rectangular opening was formed in the electron beam resist layer. A part of the major surface was exposed to the rectangular opening, and gold was sputtered onto the entire surface of the structure. The gold film was held in contact with the exposed area of the major surface, and extended over the electron beam resist layer. The electron beam resist layer was stripped off, and the gold film was left on the exposed area of the major surface. The remaining gold film served as the lower electrode 22a.

$Nd_{0.7}Sr_{0.3}MnO_3$, gold and $Sm_{0.65}Sr_{0.35}MnO_3$ were successively deposited to 1 micron thick, 0.5 micron thick and 1 micron thick over the entire surface of the structure by using a laser ablation, and a resist mask of 1 micron square was provided over the $Sm_{0.65}Sr_{0.35}MnO_3$ layer in such a manner that the right end portion of the lower electrode 22a was overlapped with the resist mask through the electron beam lithography. Using an ion milling, the $Nd_{0.7}Sr_{0.3}MnO_3$ layer, the gold layer and the $Sm_{0.65}Sr_{0.35}MnO_3$ layer were patterned into the p-portion 20a, the n-portion 20b and the d-portion 20c stacked on the lower electrode 22a.

Finally, the upper electrode 22b was formed through the electron beam lithography, the sputtering and the lift-off as similar to the lower electrode 22a.

$Sm_{0.65}Sr_{0.35}MnO_3$ is higher in Curie point than $Nd_{0.7}Sr_{0.3}MnO_3$, and, accordingly, the d-portion 20c was larger in coercive force than the p-portion at an arbitrary temperature. For this reason, when the magnetometric sensor was placed in a magnetic field between the coercive force of the p-portion 20a and the coercive force of the d-portion 20c, only the p-portion changed the direction of the magnetization.

The present inventors evaluated the first example as similar to the first example of the first embodiment. The p-portion 20a and the d-portion 20c were initially magnetized in parallel to the major surface as indicated by arrow AR31, and electric current flowed from the lower electrode 22a through the magnetometric sensor 20 to the upper electrode 22b as indicated by arrow AR32. The resistance was changed around 80 G, and the rate of increase was 200 percent.

EXAMPLE 2

The second example was fabricated as similar to the first example except for the almost perfectly polarized materials. In the second example, the p-portion 20a was formed of $HgSr_2LaMn_2O_8$, and the d-portion 20c was formed of $PbSr_3Mn_2O_8$.

The present inventors evaluated the second example as similar to the first example. The resistance was changed around 70 G, and the rate of increase was 150 percent.

EXAMPLE 3

The third example was fabricated as similar to the first example except for the almost perfectly polarized materials. In the third example, the p-portion 20a was formed of $(Tl_{0.7}Y_{0.3})_2(Mn_{0.9}Fe_{0.1})_2O_7$, and the d-portion 20c was formed of $(Tl_{0.7}Pb_{0.3})_2Mn_2O_7$.

The present inventors evaluated the third example as similar to the first example. The resistance was changed around 55 G, and the rate of increase was 100 percent.

EXAMPLE 4

The fourth example was fabricated as similar to the first example except for the almost perfectly polarized materials and the non-magnetic material. In the fourth example, the p-portion 20a and the d-portion 20c were respectively formed of $La_{0.8}Ca_{0.2}Mn_{0.9}Pd_{0.1}O_3$ and $La_{0.8}Ca_{0.2}Mn_{0.9}Re_{0.1}O_3$, and the n-portion 20b was formed of heavily doped n-type silicon.

The present inventors evaluated the fourth example as similar to the first example. The resistance was changed around 60 G, and the rate of increase was 125 percent.

EXAMPLE 5

The fifth example was fabricated as similar to the first example except for the almost perfectly polarized materials.

In the fifth example, the p-portion 20a was formed of $La_{0.7}Sr_{0.3}MnO_3$, and the d-portion 20c was formed of permalloy.

The present inventors evaluated the fifth example as similar to the first example. The initial magnetization was in parallel to the major surface of the substrate 21. The resistance was changed around 50 G, and the rate of increase was 70 percent.

Third Embodiment

Figure 10:
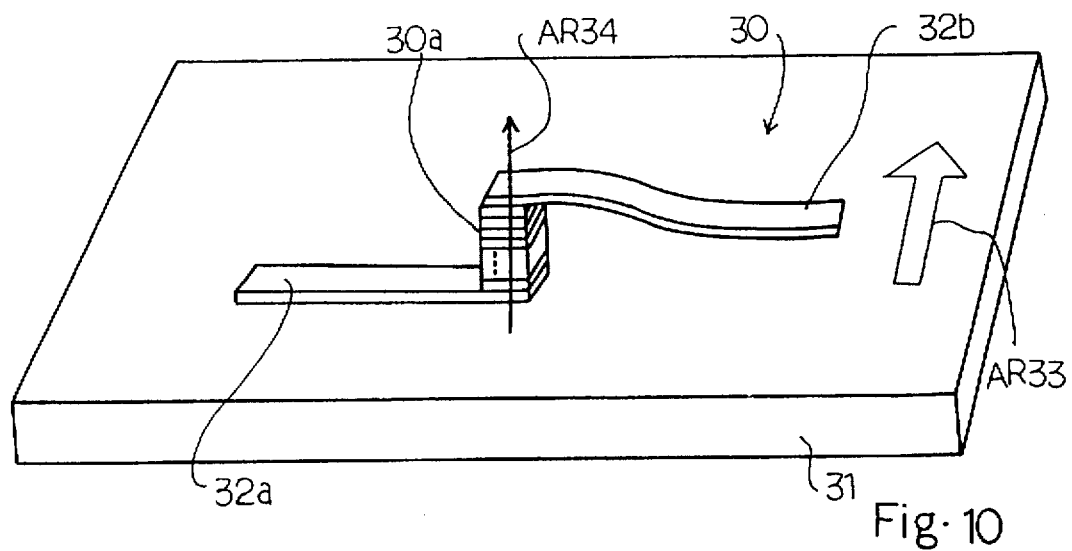
FIG. 10 is a perspective view showing the structure of yet another magnetometric sensor according to the present invention.

Turning to FIG. 10 of the drawings, yet another magnetometric sensor 30 embodying the present invention is fabricated on a substrate 31. The magnetometric sensor 30 comprises a multi-layer structure 30a sandwiched between a lower electrode 32a and an upper electrode 32b.

Figure 11:
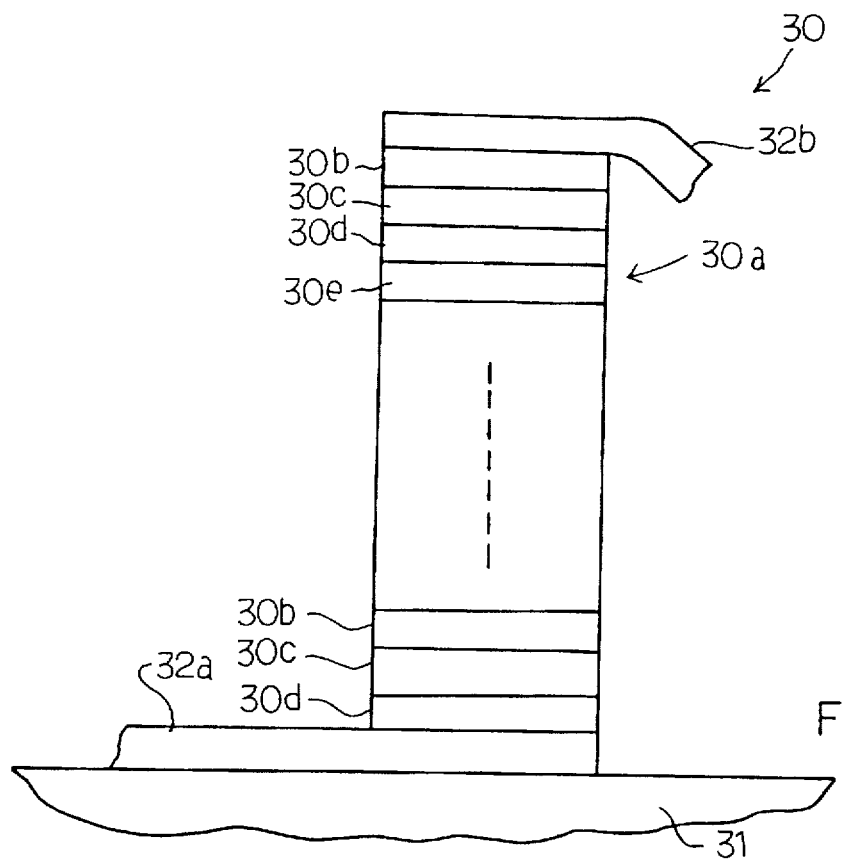
FIG. 11 is a side view showing a multi-layer structure incorporated in the magnetometric sensor shown in FIG. 10.

As will be better seen in FIG. 11, a first almost perfectly spin-polarized material layer 30b, a first paramagnetic metal layer 30c, a second almost perfectly spin-polarized material layer 30d different in coercive force from the first almost perfectly spin-polarized material layer 30b and a second paramagnetic metal layer 30e form in combination a sensor unit, and a plurality of sensor units are stacked on the lower electrode 32a. However, the second paramagnetic metal layer 30e is deleted from the lowest sensor unit, and, accordingly, the lower electrode 32a is directly held in contact with the second almost perfectly spin-polarized material layer 30d.

EXAMPLE 1

The present inventors fabricated the first example of the magnetometric sensor 30 on the substrate 31 of $SrTiO_3$ through a process sequence analogous to the process described in conjunction with the first example of the second embodiment.

The first almost perfectly spin-polarized material layer 30b was formed of $Nd_{0.7}Sr_{0.3}MnO_3$, the first and second paramagnetic metal layers 30c and 30e were formed of $La_{1.7}Sr_{0.3}Cu_2O_4$, and the second almost perfectly spin-polarized material layer 30d was formed of $La_{0.65}Sr_{0.35}MnO_3$. The sensor unit was repeated three times between the lower electrode 32a and the upper electrode 32b. The first and second almost perfectly spin-polarized material layers 30b and 30d were 1 micron thick, and the first and second paramagnetic metal layers 30c and 30e were as thin as 0.1 micron.

Although both of $Nd_{0.7}Sr_{0.3}MnO_3$ and $La_{0.65}Sr_{0.35}MnO_3$ had conduction electrons the spin axes of which were almost perfectly polarized, $La_{0.65}Sr_{0.35}MnO_3$ was larger in coercive force than $Nd_{0.7}Sr_{0.3}MnO_3$. $La_{1.7}Sr_{0.3}Cu_2O_4$ was non-magnetic material, and had electric conductivity at room temperature.

The present inventors evaluated the first example as similar to the first example of the second embodiment. Namely, all the ferromagnetic material layers were oriented to the predetermined direction, and caused the first example to detect a magnetic field between the coercive forces of the two ferromagnetic material layers. The magnetoresistance was changed around 70 G, and the rate of increase was 200 percent.

EXAMPLE 2

The present inventors fabricated the second example as similar to the first example. The non-magnetic material layer of $La_{1.7}Sr_{0.3}Cu_2O_4$ was replaced with gold layers. The present inventors confirmed that the second example achieved the sensitivity of the first example.

Fourth Embodiment

Although the magnetometric sensors implementing the second and third embodiments are stacked on the substrates, still another magnetometric sensor embodying the present invention is repeated on the major surface of a substrate.

EXAMPLE 1

Figure 12:
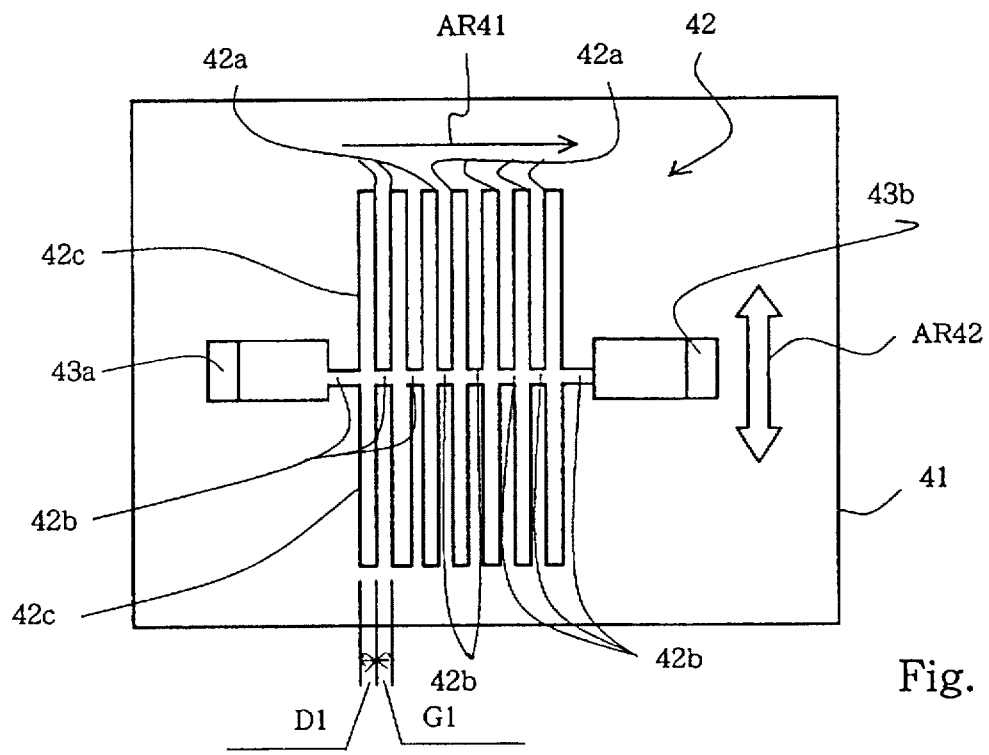
FIG. 12 is a plan view showing the first example of still another magnetometric sensor according to the present invention.

The present inventors fabricated the first example on a substrate 41 of $SrTiO_3$ as shown in FIG. 12. A comb-like pattern 42 of $Tl_2Mn_2O_7$ was formed on the major surface of the substrate 41, and a pair of electrodes 43a/43b of gold is provided for the comb-like pattern 42. The comb-like pattern 42 was 0.1 micron thick, and a wide portion 42a and a narrow portion 42b were alternated between the elecrodes 43a and 43b. The wide portions 42a were 1 micron in width D1, and a gap G1 of 0.5 micron took place between adjacent two wide postions 42a.

The wide portions 42a were spontaneously magnetized in parallel to the side edges 42c due to the shape anisotropy, and the magnetic field created by the adjacent wide portions made the direction of magnetization in one of the wide portions 42a opposite to the direction of magnetization in the adjacent wide portions 42a. The domain walls were created in the narrow portions 42b. As a result, the invertedly magnetized portions were alternately arranged in the direction of electric current AR41, and the comb-like pattern 42 provided a large ressitance. However, when a magnetic field was created in the direction represented by arrow AR42 perpendicular to the current, the wide portions 42a were uniformly magnetized, and decreased the resistance. The magnetometric sensor changed the resistance around 50 G, and the rate of change was 200 percent. Thereafter, the magnetic field was removed, and the magnetometric sensor was recovered to the initial state.

EXAMPLE 2

Figure 13:
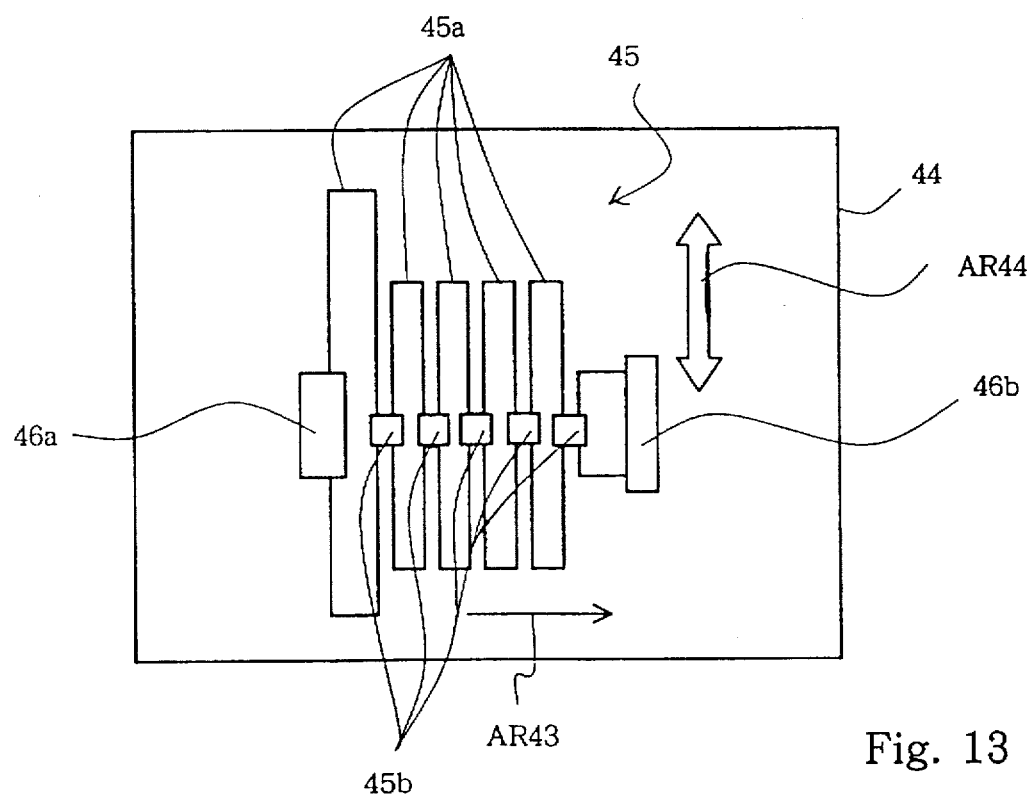
FIG. 13 is a plan view showing the second example of the magnetometric sensor according to the present invention.

The present inventors further fabricated the second example on a substrate 44 of $SrTiO_3$ as shown in FIG. 13. A plurality of wide portions 45a were formed from a thin film of $La_{0.7}Sr_{0.3}MnO_3$, and were spaced from one another at intervals. A plurality of narrow portions 45b of gold were inserted between the wide portions 45a, and the wide portions 45a and the narrow portions 45b formed in combination a comb-like pattern 45. The leftmost wide portions 45a and the rightmost wide portion 45b were partially overlapped with electrodes 46a and 46b of gold.

The present inventors evaluated the second example as similar to the first example. A magnetic field was represented by arrow AR44. The second example behaved as similar to the first example, and changed the resistance around 40 G. The rate of change was 150 percent.

Third Example

Figure 14:
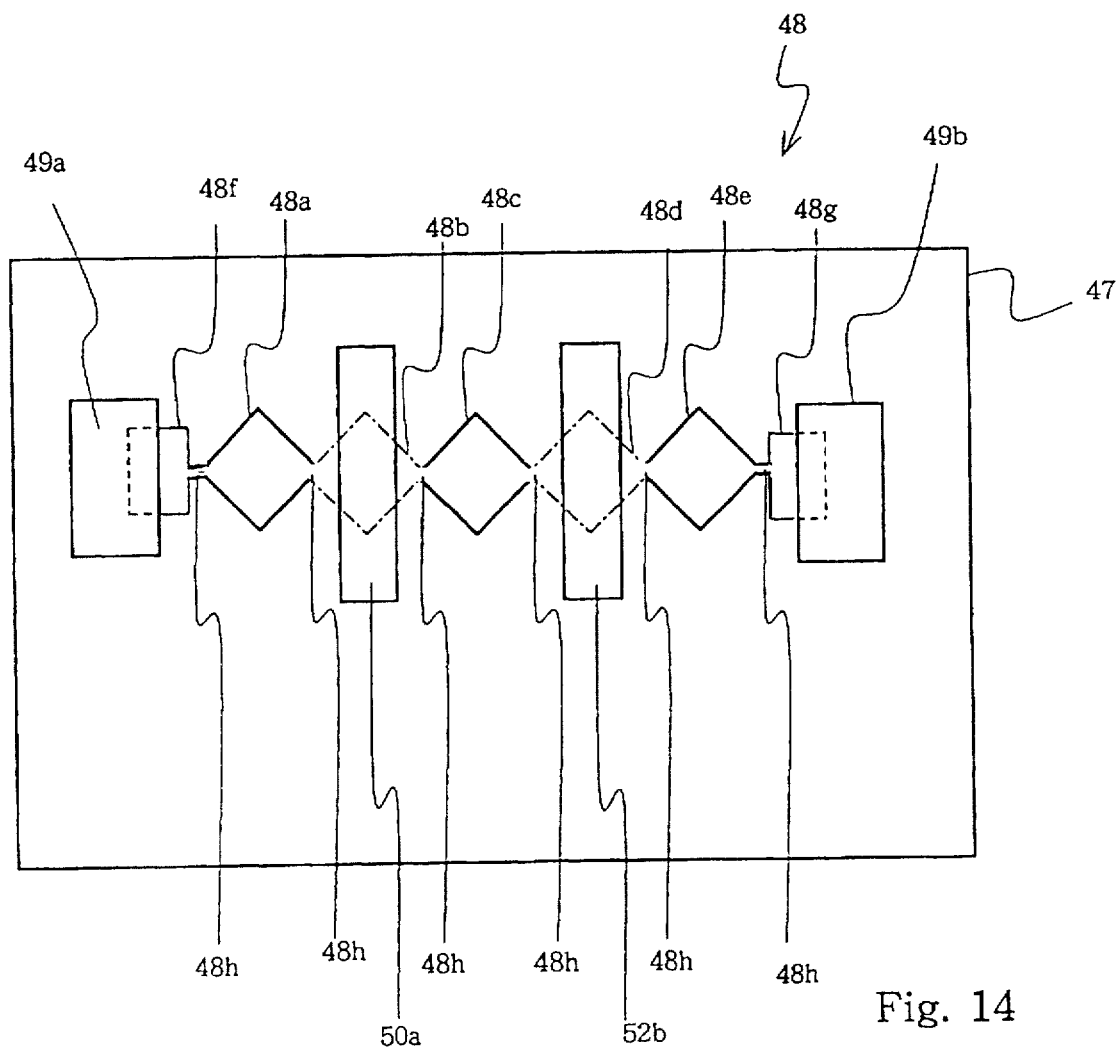
FIG. 14 is a plan view showing the third example of the magnetometric sensor according to the present invention.

The present inventors fabricated the third example on a substrate 47 of $SrTiO_3$ as shown in FIG. 14. A thin film of $La_{0.7}Sr_{0.3}MnO_3$ was formed into a diaper pattern 48, i.e., a series of diamond-shaped portions 48a to 48e accompanied with two rectangular portions 48f/48g, and the rectangular portions 48f/48g were partially overlapped with electrodes 49a/49b of gold. A magnetization fixing layer 50a/50b was provided on every other diamond-shaped portion, and was formed of permalloy. A domain wall took place in every constricted portion 48h.

The present inventors evaluated the third example as similar to the first example. The third example changed the resistance around 60 G, and the rate of change was 150 percent.

Figure 15:
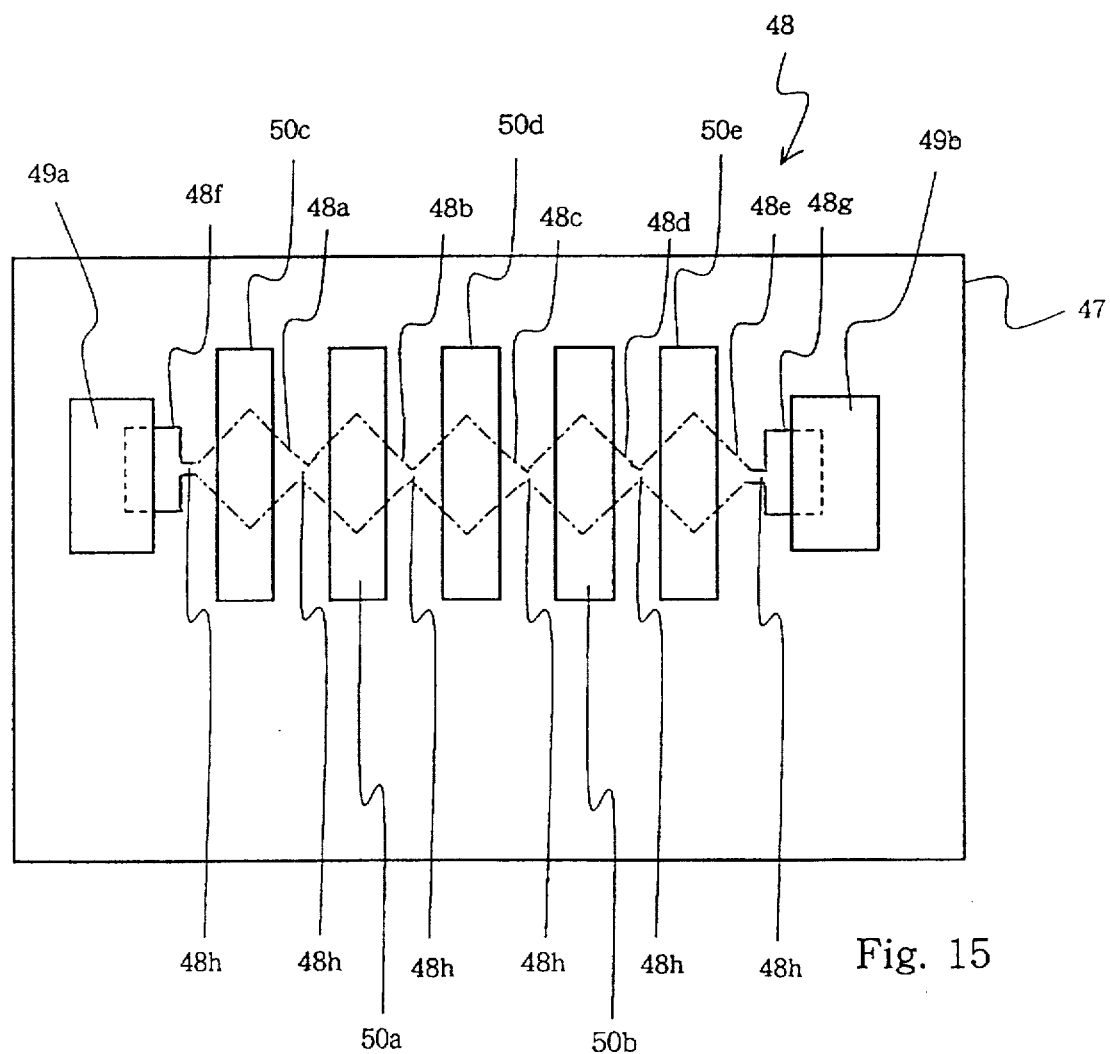
FIG. 15 is a plan view showing a modification of the third example of the magnetometric sensor shown in FIG. 14.

Although the third example has the magnetization fixing layer 50a/50b of permalloy on every other diamond-shaped portion 48b/48d, other magnetization fixing layers 50c, 50d and 50e of different ferromagnetic material may be alternated with the magnetization fixing layers 50a and 50b as shown in FIG. 15. In this instance, the magnetization fixing layers 50c to 50e are formed of iron. However, any combination of different ferromagnetic materials is available for the magnetization fixing layers 50a to 50e.

The magnetization fixing layers of iron and the magnetization fixing layers of permalloy maintain the spontaneous magnetization in the absence of a magnetic field to be measured, and the diaper pattern 48 of the almost perfectly spin-polarized material changes the resistance due to the relatively oriented magnetization. Thus, the diaper pattern 48 and the magnetization fixing layers 48a to 48e respectively bear the change of resistance and the maintenance of magnetization, and this feature is suitable for an almost perfectly spin-polarized material with small residual magnetization.

Magnetic Head

Figure 16:
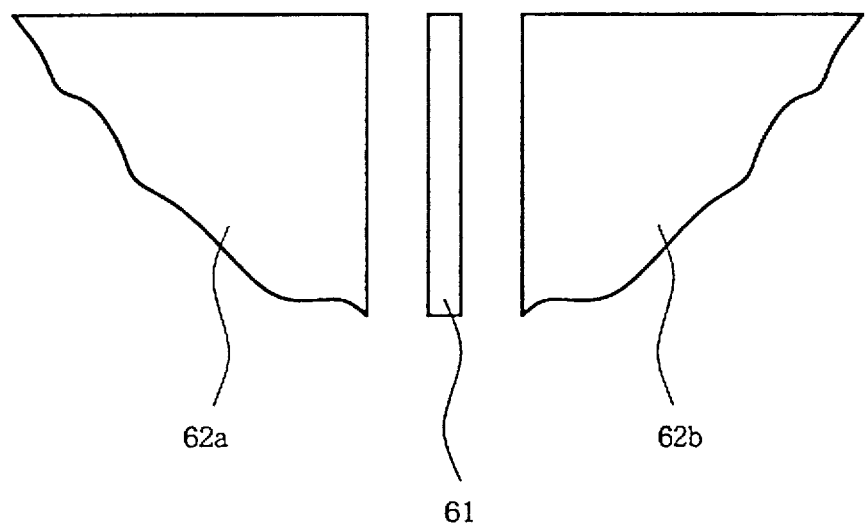
FIG. 16 is a schematic view showing an MR head equipped with the magnetometric sensor according to the present invention.

One of the first to fourth embodiments is available for any kind of MR head. FIG. 16 illustrates a shield-type MR head. The magnetometric sensor 61 is provided in a gap between shield members 62a and 62b.

As will be appreciated from the foregoing description, the magnetometric sensor according to the present invention achieves the sensitivity equal to or greater than 1 percent/G, and is available for a highly sensitive magnetic head.

Both the stacked type, i.e., the second and third embodiments and the planar type, i.e. the first and fourth embodiments have a high sensitivity. However, the planar type magnetometric sensor is fabricated through a process simpler than that of the stacked type magnetometric sensor. Another attractive feature of the planar type magnetometric sensor is that a shape anisotropy is easily obtained, and, accordingly, is formed of only one almost perfectly spin-polarized material.

In the above examples, $La_{0.7}Sr_{0.3}MnO_3$, $Nd_{0.7}Sr_{0.3}MnO_3$, $Sm_{0.65}Sr_{0.35}MnO_3$, $La_{0.65}Sr_{0.35}MnO_3$ have a perovskite crystal structure, and $Tl_2Mn_2O_7$, $TlInMn_2O_7$, $(Tl_{0.7}Y_{0.3})_2(Mn_{0.9}Fe_{0.1})_2O_7$, $(Tl_{0.7}Pb_{0.3})_2Mn_2O_7$ have a pyrochroa crystal structure. $HgSr_2LMn_2O_8$, $PbSr_3Mn_2O_8$ have a perovskite analogous laminated crystal structure.

Although particular embodiments of the present invention have been shown and described, it will be obvious to those skilled in the art that various changes and modifications may be made without departing from the spirit and scope of the present invention.

For example, the magnetization fixing layer may be formed of antiferromagnetic material.

Moreover, one of the p-portion and the d-portion may be formed of ferromagnetic material without spin-polarization such as, for example, iron or permalloy. When one of the p-portion and the d-portion is formed of iron or permally, the sensitivity is decreased to a half of that of the magnetometric sensor having the p-portion and the d-portion both formed of the almost perfectly spin-polarized material. However, the sensitivity is large enough to use in a magnetic head. Moreover, the ferromagnetic materials such as iron and permalloy have a coercive force larger than that of the almost perfectly spin-polarized material with the perovskite crystal structure, and the ferromagnetic material is combinable with any almost perfectly spin-polarized material.

The almost perfectly spin-polarized material may be ferromagnetic oxide expressed by the general formula of $$L_{1-x}A_xMO_3$$

where L is at least one lanthanide, A is at least one element selected from the group consisting of Ca, Sr and Ba, M is Mn or an alloy containing Mn and at least one metal selected from the group consisting of 3d, 4d and 5d transition metals and x ranges from 0.01 to 0.5. The ferromagnetic oxide may have a perovskite crystal structure and expressed by the general formula of $$La_{1-x}A_xMnO_3$$

where A is an element selected from the group consisting of Ca, Sr and Ba and x ranges from 0.01 to 0.5.

The almost perfectly spin-polarized material may be ferromagnetic oxide having a pyrochroa crystal structure and expressed by the general formula of $$D_2M_2O_7$$

where D is at least one element selected from the group consisting of Tl, In, Bi, Pb, Ir and lanthanides, M is at least one element selected from the group consisting of 3d, 4d and 5d transition metals. The ferromagnetic oxide may be expressed by the general formula of $$(Tl_{1-x}In_x)_2Mn_2O_7$$

where x ranges from 0 to 1.

The almost perfectly spin-polarized material may be ferromagnetic oxide having a perovskite analogous laminated crystal structure and expressed by the general formula of $$E_xR_{y+1}M_yO_z$$

where E is at least one element selected from the group consisting of Tl, Bi, Pb and Hg, R is at least one metal selected from the group II-A elements and lanthanides, M is Mn or an alloy consisting of Mn and at least one metal selected from the group consisting of 3d, 4d and 5d transition metals, x is 1 or 2, y ranges from 1 to 4 and z is an arbitrary number. M may be manganese.

What is claimed is:

1. A magnetometric sensor for detecting a variation of a magnetic field strength, comprising:
   a first portion and a second portion different in coercive force, at least one of said first portion and said second portion being formed of a first almost perfectly spin-polarized material where spin axes of conduction electrons change a direction thereof in the presence of said variation of said magnetic field strength; and
   a third portion formed between said first portion and said second portion, and providing a potential gap between a Fermi surface of said first portion and a Fermi surface of said second portion due to the change of direction of said spin axes.

2. The magnetometric sensor as set forth in claim 1, in which the other of said first portion and said second portion is formed of a second almost perfectly spin-polarized material.

3. The magnetometric sensor as set forth in claim 2, in which said first almost perfectly spin-polarized material is identical in composition with said second almost perfectly spin-polarized material.

4. The magnetometric sensor as set forth in claim 3, in which said third portion is formed of a non-magnetic material, and at least one of said first portion and said second portion is associated with a magnetization fixing layer formed of one of ferromagnetic material and antiferromagnetic material.

5. The magnetometric sensor as set forth in claim 3, in which said third portion is formed of a non-magnetic material, and there is a shape anisotropy between said first portion and said second portion so that said coercive force is different therebetween.

6. The magnetometric sensor as set forth in claim 3, in which said third portion is formed of a third almost perfectly spin-polarized material identical in composition with said first and second almost perfectly spin-polarized materials, and is narrower than said first portion and said second portion.

7. The magnetometric sensor as set forth in claim 2, in which said first almost perfectly spin-polarized material is different in composition from said second almost perfectly spin-polarized material, and said third portion is formed of a non-magnetic material.

8. The magnetometric sensor as set forth in claim 7, in which said first portion, said third portion and said second portion are successively stacked over a substrate.

9. The magnetometric sensor as set forth in claim 2, in which said first almost perfectly spin-polarized material is different in composition from said second almost perfectly spin polarized material, and said third portion is formed of a paramagnetic material.

10. The magnetometric sensor as set forth in claim 9, in which said first portion, said third portion and said second portion form a sensor unit, a plurality of sensor unit are stacked on an electrode formed on a substrate, and an inter-level layer of said paramagnetic material is inserted between every two of said plurality of sensor units.

11. The magnetometric sensor as set forth in claim 6, in which said first portion, said third portion and said second portion form a unit, and a plurality of units are connected in series between electrodes on a substrate.

12. The magnetometric sensor as set forth in claim 3, in which said third portion is formed of a non-magnetic material, said first portion, said third portion and said second portion form a unit, a plurality of units are connected in series between electrodes on a substrate.

13. The magnetometric sensor as set forth in claim 1, in which the other of said first portion and said second portion is formed of a ferromagnetic material conduction electrons of which have spin axes substantially not polarized.

14. The magnetometric sensor as set forth in claim 2, in which said first almost perfectly spin-polarized material and said second almost perfectly spin-polarized material are ferromagnetic oxide expressed by the general formula of $$L_{1-x}A_xMO_3$$

where L is at least one lanthanide, A is at least one element selected from the group consisting of Ca, Sr and Ba, M is Mn or an alloy containing Mn and at least one metal selected from the group consisting of 3d, 4d and 5d transition metals and x ranges from 0.01 to 0.5.

15. The magnetometric sensor as set forth in claim 2, in which said first almost perfectly spin-polarized material and said second almost perfectly spin-polarized material are ferromagnetic oxide having a perovskite crystal structure and expressed by the general formula of $La_{1-x}A_xMnO_3$ where A is at least one element selected from the group consisting of Ca, Sr and Ba and x ranges from 0.01 to 0.5.

16. The magnetometric sensor as set forth in claim 2, in which said first almost perfectly spin-polarized material and said second almost perfectly spin-polarized material are ferromagnetic oxide having a pyrochroa crystal structure and expressed by the general formula of $D_2M_2O_7$ where D is at least one element selected from the group consisting of Tl, In, Bi, Pb, Ir and lanthanides, M is at least one element selected from the group consisting of 3d, 4d and 5d transition metals.

17. The magnetometric sensor as set forth in claim 2, in which said first almost perfectly spin-polarized material and said second almost perfectly spin-polarized material are ferromagnetic oxide having a pyrochroa crystal structure and expressed by the general formula of $(Tl_{1-x}In_x)_2Mn_2O_7$ where x ranges from 0 to 1.

18. The magnetometric sensor as set forth in claim 2, in which said first almost perfectly spin-polarized material and said second almost perfectly spin-polarized material are ferromagnetic oxide having a perovskite analogous laminated crystal structure and expressed by the general formula of $E_xR_{y+1}M_yO_z$ where E is at least one element selected from the group consisting of Tl, Bi, Pb and Hg, R is at least one metal selected from the group II-A elements and lanthanides, M is Mn or an alloy consisting of Mn and at least one metal selected from the group consisting of 3d, 4d and 5d transition metals, x is 1 or 2, y ranges from 1 to 4 and z is an arbitrary number.

19. The magnetometric sensor as set forth in claim 18, where M is manganese.

20. A magnetic head comprising a magnetometric sensor for detecting a variation of a magnetic field strength, said magnetometric sensor including a first portion and a second portion different in coercive force, at least one of said first portion and said second portion being formed of a first almost perfectly spin-polarized material where spin axes of conduction electrons change a direction thereof in the presence of said variation of said magnetic field strength, and a third portion formed between said first portion and said second portion, and providing a potential gap between a Fermi surface of said first portion and a Fermi surface of said second portion due to the change of direction of said spin axes.

* * * * *